United States Patent
Donders et al.

(10) Patent No.: US 8,610,089 B2
(45) Date of Patent: Dec. 17, 2013

(54) THERMAL CONDITIONING SYSTEM FOR THERMAL CONDITIONING A PART OF A LITHOGRAPHIC APPARATUS AND A THERMAL CONDITIONING METHOD

(75) Inventors: Sjoerd Nicolaas Lambertus Donders, Vught (NL); Vadim Yevgenyevich Banine, Deurne (NL); Johannes Hubertus Josephina Moors, Helmond (NL); Martinus Cornelis Maria Verhagen, Valkenswaard (NL); Olav Waldemar Vladimir Frijns, Rosmalen (NL); Gerrit Van Donk, Vollenhove (NL); Henk Jan Van Gerner, Zwolle (NL)

(73) Assignees: ASML Netherlands B.V., Veldhoven (NL); Stichting Nationaal Lucht—en Ruimtevaartlaboratorium, Amsterdam (NL)

( * ) Notice: Subject to any disclaimer, the term of this patent is extended or adjusted under 35 U.S.C. 154(b) by 18 days.

(21) Appl. No.: 13/449,030

(22) Filed: Apr. 17, 2012

(65) Prior Publication Data
US 2012/0267550 A1   Oct. 25, 2012

Related U.S. Application Data

(60) Provisional application No. 61/477,496, filed on Apr. 20, 2011, provisional application No. 61/587,344, filed on Jan. 17, 2012.

(51) Int. Cl.
*H01J 5/00*   (2006.01)

(52) U.S. Cl.
USPC ............. 250/492.2; 250/492.1; 250/492.3

(58) Field of Classification Search
USPC .................................. 250/492.1–492.3
See application file for complete search history.

(56) References Cited

U.S. PATENT DOCUMENTS

| | | | |
|---|---|---|---|
| 4,599,516 A * | 7/1986 | Taya et al. ................. | 250/443.1 |
| 5,486,703 A * | 1/1996 | Lovin et al. ................ | 250/492.3 |
| 5,748,225 A | 5/1998 | Ziph-Schatzberg | |
| 2004/0156026 A1 | 8/2004 | Kamiya | |
| 2005/0248739 A1 | 11/2005 | Box et al. | |
| 2007/0070324 A1 | 3/2007 | Kuit et al. | |
| 2009/0207392 A1 | 8/2009 | Rijpma et al. | |

FOREIGN PATENT DOCUMENTS

WO   2008/144923   12/2008

\* cited by examiner

*Primary Examiner* — Michael Maskell
(74) *Attorney, Agent, or Firm* — Pillsbury Winthrop Shaw Pittman LLP

(57) ABSTRACT

A conditioning system for conditioning a part of a lithographic apparatus, includes an evaporator positioned in thermal contact with the part for extracting heat from the part by evaporation of a fluid inside the evaporator; a condenser for removing heat from the fluid inside the condenser; fluid lines arranged between the evaporator and the condenser to form a fluid circuit; a pump arranged in the circuit to circulate the fluid in the circuit; an accumulator to hold fluid, wherein the accumulator is in fluid communication with the circuit and comprises a heat exchanger to transfer heat from or to fluid inside the accumulator; a temperature sensor to provide a signal representative of the fluid temperature; and a controller to maintain a substantially constant temperature of the fluid inside the circuit by regulating the amount of heat transferred by the heat exchanger based on the signal.

19 Claims, 7 Drawing Sheets

THERMAL CONDITIONING SYSTEM FOR THERMAL CONDITIONING A PART OF A LITHOGRAPHIC APPARATUS AND A THERMAL CONDITIONING METHOD

CROSS REFERENCE TO RELATED APPLICATIONS

This application claims priority and benefit under 35 U.S.C. §119(e) to U.S. Provisional Patent Application Ser. No. 61/477,496, entitled "A Two-Phase Cooling System For Cooling A Part Of A Lithographic Apparatus and Cooling Method", filed on Apr. 20, 2011, and to U.S. Provisional Patent Application Ser. No. 61/587,344, entitled "A Cooling System For Cooling A Part Of A Lithographic Apparatus and A Cooling Method", filed on Jan. 17, 2012. The contents of those applications are incorporated herein in their entirety by reference.

FIELD

The present invention relates to a thermal conditioning system for thermal conditioning a part of a lithographic apparatus and a corresponding thermal conditioning method.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

During operation of the lithographic apparatus there may be parts of the lithographic apparatus that are cooled and/or heated, for instance due to dissipation of heat in electromagnetic actuators or irradiation by an optical beam etc. Currently these parts are cooled by using e.g. liquid, such as water, which is pumped around in a circuit. The water extracts heat from the part to be cooled while passing the part after which the collected heat is dumped, i.e. removed, using a heat exchanger downstream of the part, such that the water is able to return to the part to extract heat again.

The cooling efficiency of this method depends on the flow type in the channels of the circuit at or near the part. A turbulent flow of the water has a higher heat transfer coefficient than a laminar flow of the water. Using small channels, which is beneficial from a design and weight point of view, has the disadvantage that a laminar flow is formed and thus decreases the cooling efficiency. The cooling efficiency of the method may be that poor that the temperature of the part raises to an undesired level which influences other parts, e.g. by heat radiation, and thereby reduces the obtainable accuracy of the lithographic apparatus.

SUMMARY

It is desirable to provide a thermal conditioning system for thermal conditioning a part of a lithographic apparatus having an improved cooling efficiency while still being able to use small cooling channels. To achieve this, there is provided a two-phase thermal conditioning system according to an embodiment of the invention for thermal conditioning a part of a lithographic apparatus, comprising: an evaporator to be positioned in thermal contact with the part of the lithographic apparatus for extracting heat from the part by evaporation of a fluid inside the evaporator; a condenser to be positioned at a distance from the part of the lithographic apparatus for removing heat from the fluid inside the condenser by condensation of the fluid inside the condenser; fluid lines arranged between the evaporator and the condenser to form a circuit in which fluid is able to flow; a pump arranged in the circuit to circulate the fluid in the circuit; an accumulator configured to hold fluid; wherein the accumulator is in fluid communication with the circuit and comprises a heat exchanger to transfer heat from or to fluid inside the accumulator; a temperature sensor configured to provide a measurement signal representative of the temperature of the fluid and a controller configured to maintain a substantially constant temperature of the fluid inside the circuit by regulating the amount of heat transferred by the heat exchanger from or to fluid inside the accumulator based on the measurement signal.

According to another aspect of the invention, there is provided a lithographic apparatus comprising: an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate and a two-phase thermal conditioning system for thermal conditioning a part of a lithographic apparatus, comprising: an evaporator to be positioned in thermal contact with the part of the lithographic apparatus for extracting heat from the part by evaporation of a fluid inside the evaporator; a condenser to be positioned at a distance from the part of the lithographic apparatus for removing heat from the fluid inside the condenser by condensation of the fluid inside the condenser; fluid lines arranged between the evaporator and the condenser to form a circuit in which fluid is able to flow; a pump arranged in the circuit to circulate the fluid in the circuit; an accumulator configured to hold fluid; wherein the accumulator is in fluid communication with the circuit and comprises a heat exchanger to transfer heat from or to fluid inside the accumulator; a temperature sensor configured to provide a measurement signal representative of the temperature of the fluid and a controller configured to maintain a substantially constant temperature of the fluid inside the circuit by regulating the amount of heat transferred by the heat exchanger from or to fluid inside the accumulator based on the measurement signal.

According to a further aspect of the invention, there is provided a two-phase thermal conditioning system for thermal conditioning a part of a lithographic apparatus, the system comprising: an evaporator to be positioned in thermal contact with the part of the lithographic apparatus for extracting heat from the part by evaporation of a fluid inside the evaporator; a condenser to be positioned at a distance from the part of the lithographic apparatus for removing heat from the fluid inside the condenser by condensation of the fluid inside the condenser; fluid lines arranged between the evaporator and the condenser to form a circuit in which fluid is able to flow; a pump arranged in the circuit to circulate the fluid in the circuit; a bypass fluid line starting at a location in the circuit in between the condenser and the pump and ending at a location in the circuit in between the evaporator and the condenser, as close as possible to an exit of the evaporator; and a second pump arranged in the bypass fluid line.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
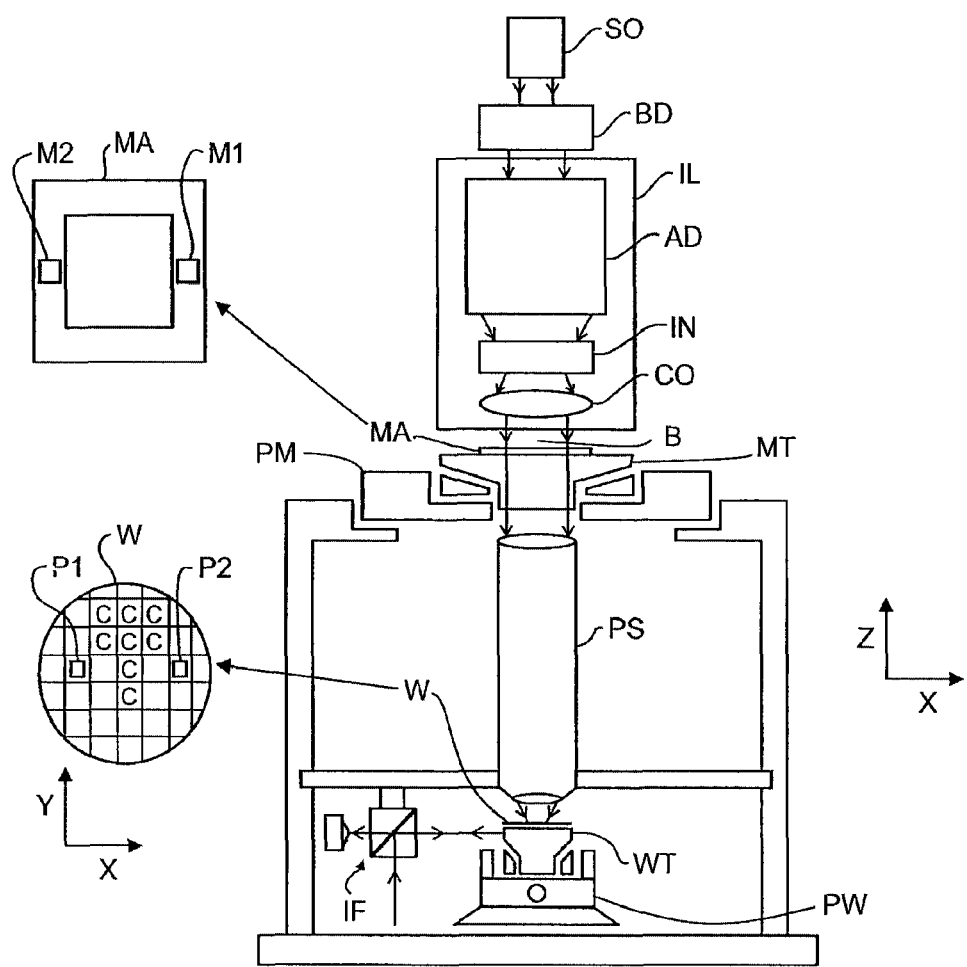
FIG. 1 depicts a lithographic apparatus according to an embodiment of the invention.

FIG. 1 schematically depicts a lithographic apparatus. The apparatus includes an illumination system (illuminator) IL configured to condition a radiation beam B (e.g. UV radiation or any other suitable radiation), a patterning device support or mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing minors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
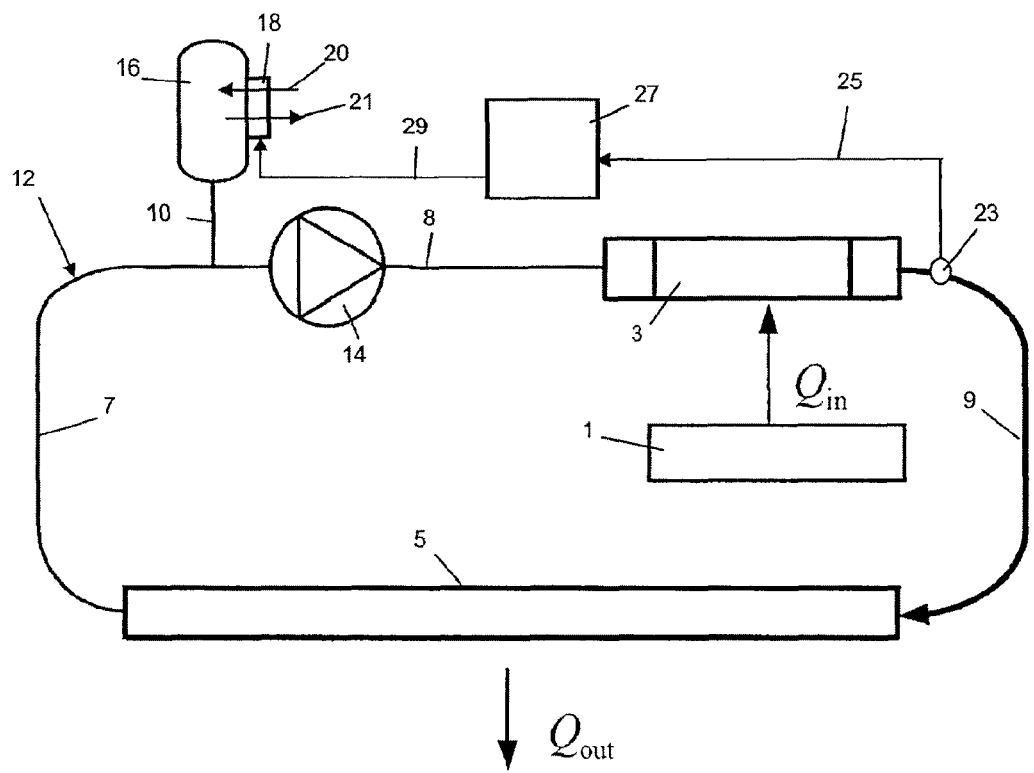
FIG. 2 depicts schematically a thermal conditioning system according to an embodiment of the invention.

FIG. 2 depicts a schematic representation of a two-phase cooling system according to an embodiment of the invention. The cooling system comprises an evaporator 3 to be positioned or mounted in thermal contact with a part 1 of a lithographic apparatus, e.g. the lithographic apparatus according to FIG. 1. The part 1 may be an optical element heated by irradiation or an electromagnetic actuator part as may be used in the different positioning systems of the lithographic apparatus. The part 1 may further be a beam dump e.g. for absorbing the energy from a CO2 laser used to generate tin plasma in a lithographic apparatus that uses extreme ultraviolet (EUV) radiation. Also, the part 1 may be one or more of the following components: a grazing incidence collector, a near-normal incidence collector, a foil trap, a mirror, e.g. a field facets mirror or a pupil facets mirror, a rema blade, a reticle stage, a wafer stage, a reticle, or a wafer table. It will be appreciated that part 1 may be any part of the apparatus that needs to be thermally conditioned according to an embodiment. When the evaporator 3 is provided in thermal contact with the part 1, heat Qin can be extracted from the part 1 by evaporation of a fluid inside the evaporator 3. It is noted here that fluid may refer to both liquid and vapor. In case the distinction between liquid and vapor is relevant it will be indicated by fluid in the liquid phase and fluid in the gas phase respectively.

The cooling system further comprises a condenser 5 to be positioned at a distance from the part 1 of the lithographic apparatus for removing heat Qout from the fluid inside the condenser 5 by condensation of the fluid inside the condenser 5.

The cooling system further comprises a pump 14. Fluid lines 7, 8, and 9 are provided between respectively the condenser 5 and the pump 14, between the pump 14 and the evaporator 3, and between the evaporator 3 and the condenser 5 in order to form a circuit 12 in which fluid can be circulated by the pump 14.

An accumulator 16 is provided to hold fluid, the accumulator being in fluid communication with the circuit 12 via fluid line 10. This allows to exchange fluid between the accumulator 16 and the circuit 12, e.g. due to density changes between fluid in the gas phase and fluid in the liquid phase. The accumulator comprises a heat exchanger 18 to transfer heat from (as indicated by arrow 21) or to (as indicated by arrow 20) fluid inside the accumulator for evaporation or condensation of the fluid in order to adapt for volume changes of the fluid in the circuit 12. In use, the fluid held by the accumulator is, in an embodiment, partially in the liquid phase and partially in the gas phase.

The heat exchanger 18 is controlled by a control unit or controller 27 via control signal 29. The control unit 27 is configured to maintain a substantially constant temperature of the fluid inside the circuit 12 by regulating the amount of heat transferred by the heat exchanger 18 from (arrow 21) or to (arrow 20) fluid inside the accumulator based on a measurement signal 25 which is provided by temperature sensor 23 and which is representative for the temperature of the fluid in the circuit 12.

The working principle of the thermal conditioning system can be explained as follows:

The actual temperature of the fluid inside the circuit 12 is, in an embodiment, equal or close to the desired temperature of the part 1 of the lithographic apparatus, e.g. 22 degrees Celsius. Alternatively, the actual temperature of the fluid inside the circuit may be below the desired temperature of the part 1 of the lithographic apparatus in order to create a larger temperature difference between fluid in the circuit and part 1 of the lithographic apparatus. The actual temperature of the fluid inside the circuit is therefore in an embodiment between 10-25 degrees Celsius and in another embodiment between 20-22 degrees Celsius. In other applications, the actual temperature of the fluid inside the circuit may also be between −250 and 100 degrees Celsius.

Furthermore, the actual temperature of the fluid inside the circuit 12 is in an embodiment equal or close to the saturation temperature of the fluid. The saturation temperature of the fluid can be controlled by the pressure inside the circuit. Table 1 discloses some fluids that are suitable to be used in combination with a cooling system according to an embodiment of the invention and shows the saturation pressure required to set the saturation temperature of the fluid at 22 degrees Celsius. Other fluids and/or other pressures can be used to set the saturation temperature at another value.

A benefit of the fluids mentioned in Table 1 is that the pressures are relatively high, which results in a relatively low pressure drop in the circuit compared to fluids at lower pressures. The pressure inside the circuit 12 is thus above 2 bar in an embodiment, for example above 5 bar in another embodiment, for example above 10 bar in an embodiment and for example above 25 bar in another embodiment. The effect of a relatively low pressure drop in the circuit combined with a lower sensitivity of the temperature to the pressure drop results in reduced temperature variations of the fluid inside circuit 12. From that point of view, the use of $CO_2$ is beneficial as this requires the highest pressure. An additional benefit of $CO_2$ is that the heat transfer rate for $CO_2$ is rated linear with the heat flux, which means that the temperature remains stable independent of the heat load.

TABLE 1 suitable fluids with pressure required for saturation temperature at 22 degrees Celsius

| Fluid | Pressure (bar) | Fluid | Pressure (bar) |
| --- | --- | --- | --- |
| Ammonia | 9 | R41 | 35 |
| H2S | 19 | N2O | 53 |
| CO2 | 60 | Ethane | 39 |
| R32 | 15 | Propylene | 11 |
| Propane | 9 | DME | 5.4 |
| R22 | 9.6 | R134a | 6 |
| 2-butene | 2.1 | | |

From a theoretical point of view, the saturation temperature of the fluid should be as close to the actual temperature of the fluid as possible such that the main portion, all of the heat transferred in the evaporator and condenser is latent heat, thereby obtaining the maximum heat transfer coefficient. In such a case, the fluid in the fluid lines 7 and 8 are transported in the liquid phase by the pump to the evaporator where it is at least partially evaporated so that the fluid in fluid line 9 may be in the gas phase or there is a mixed flow of gas and liquid. The fluid is then passed on to the condenser where it is condensed such that all gas/vapor is returned to the liquid phase. However, in practice, such a perfect match between saturation temperature and actual temperature may not be desired as it may result in cavitation inside the pump which may damage the pump. To avoid cavitation, the temperature of the fluid passing the pump is, in an embodiment, a few degrees below the saturation temperature which can be obtained by appropriately cooling using the condenser or an additional cooler located downstream of the condenser and upstream of the pump.

The pump 14 is, in an embodiment, located upstream of the evaporator and downstream of the condenser so that the pump can be of the liquid pump type, whereas in fluid line 9, the flow may be a mixed flow and thus the requirements of the pump are more demanding if the pump is placed there.

The fluid leaving the pump 14 travels to the evaporator which is in thermal contact with the part 1 of the lithographic apparatus. When the part 1 of the lithographic apparatus has an elevated temperature relative to the temperature of the fluid inside the evaporator, latent heat is transferred from the part 1 to the fluid inside the evaporator. Because the temperature of the fluid is close to the saturation temperature of the fluid, the transferred heat will result in the at least partial evaporation of the fluid. When the cooling system is in equilibrium, the evaporation will not result in a pressure change inside the circuit as at the same time the same amount of fluid is condensed in the condenser. However, when the amount of heat transferred from the part 1 to the evaporator changes, because the temperature of the part 1 changes, e.g. due to a change in heat generation in the part, a different amount of the fluid in the evaporator will evaporate relative to the previous equilibrium of the system.

In case less fluid is evaporated in the evaporator, the volume of the fluid leaving the evaporator is smaller than before. As a result, the pressure and thus the temperature of the fluid inside the circuit decreases. This decrease in temperature of the fluid in the circuit is measured by the temperature sensor 23 and detected by the control unit or controller 27 which receives the measurement signal of the temperature sensor 23. The control unit will then in response to the decrease in temperature provide a control signal 29 to the heat exchanger 18 such that the heat exchanger will transfer heat to the fluid inside the accumulator 16, thereby evaporating fluid inside the accumulator which will result in a pressure and thus temperature increase so that the decrease in temperature of the fluid in the circuit 12 is counteracted and a new equilibrium is reached. During this process, fluid is transferred from the accumulator to the circuit.

In case more fluid is evaporated in the evaporator 3, the volume of the fluid leaving the evaporator is larger than before. As a result, the pressure and thus the temperature of the fluid inside the circuit increases. This increase in temperature of the fluid in the circuit is measured by the temperature sensor 23 and detected by the control unit 27 which receives the measurement signal 25 of the temperature sensor 23. The control unit will then in response to the increase in temperature provide a control signal to the heat exchanger 18 such that the heat exchanger will transfer heat from the fluid inside the accumulator, thereby condensing fluid inside the accumulator 16 which will result in a pressure and thus temperature decrease so that the increase in temperature of the fluid in the circuit 12 is counteracted and a new equilibrium is reached. During this process, fluid is transferred from the circuit to the accumulator.

The efficiency of the cooling system can be further improved by regulating the pump such that about the entire fluid flow is evaporated in the evaporator 3. This has the benefit that the pump 14 is not pumping around more fluid for the cooling process than required which demands more energy, and further, when the entire fluid flow is in the gas phase in fluid line 9, the flow resistance is less than for a mixed flow of liquid and gas. To achieve this, the pump may be regulated based on additional information, e.g. power dissipation values extracted from actuators, so that the cooling capacity can be adjusted accordingly by adjusting the settings of the pump.

In an embodiment, the circuit may comprise a heater downstream of the evaporator and upstream of the condenser which is regulated to set the temperature leaving the heater at a temperature of 1-5 degrees Celsius above the saturation temperature. By measuring the energy used by the heater to reach the temperature, the original amount of fluid in the liquid phase entering the heater can be determined This information can be used to control the pump speed to obtain a certain desired vapor quality. Another method is to supply a predetermined amount of energy to the fluid by the heater, e.g. 1-25% of the total thermal power of the cooling system, and control the temperature of the fluid leaving the heater with the pump, thereby obtaining a vapor quality between 75%-99% of the fluid leaving the evaporator.

A super heater may be provided downstream of the evaporator and upstream of the condenser, and in an embodiment as close as possible to the evaporator to fully evaporate the fluid, thereby creating a single phase retour flow to the condenser 5 which reduces the pressure drop and the volume change in the circuit 12. The super heater may be integrated with the above-mentioned heater used to control the pump 14 or may be provided in addition to the heater. In case of the latter, the super heater is, in an embodiment, located downstream of the heater such that the capacity of the super heater can be reduced.

A pre-evaporator may be provided upstream of the evaporator 3. This allows to evaporate fluid before it enters the evaporator and thus allows the evaporator to function as a condenser if necessary to transfer heat from the thermal conditioning system to the part 1 of the lithographic apparatus, thereby allowing to both cool or heat the part 1 of the lithographic apparatus and thus more easily control the temperature of the part 1 of the lithographic apparatus. The same can be obtained by reversing the pump 14 so that the condenser and evaporator are able to both switch function, i.e. evaporator 3 becomes a condenser and condenser 5 becomes an evaporator.

A benefit of a two-phase cooling system over a one-phase cooling system is that the heat transfer coefficient for a two-phase cooling system is much larger than for a one-phase cooling system. Further, the two-phase cooling allows to use relatively small channels. In fact, in a one-phase cooling system, the smaller the channels, the poorer the heat transfer. For two-phase cooling systems this behavior is opposite so that the smaller the channels, the better the heat transfer which is beneficial from design point of view, especially in cases where the available space for cooling is limited, e.g. in case of electromagnetic actuators. This is furthermore beneficial as a reduced mass flow requires a pump with less capacity. Furthermore a two-phase thermal conditioning system can be operated without lubricants (such as oil), resulting in an inherently cleaner system which is beneficial when such a system is used in e.g. a lithographic apparatus.

In this embodiment, the temperature sensor 23 is located downstream of the evaporator 3. Although in principal, the temperature sensor can be located anywhere in the circuit, even at the accumulator, providing the temperature sensor downstream of the evaporator such that the temperature of the fluid leaving the evaporator is measured has the benefit that a better temperature control is achieved in the evaporator and thus a better temperature control of the part to be thermally conditioned can be achieved. It further compensates for flow losses, i.e. pressure drop, in the circuit 12.

In an embodiment, the accumulator 16 is located downstream of the condenser 5 and upstream of the evaporator 3, so that the accumulator is able to exchange only fluid in the liquid phase with the circuit at a location where the fluid in the circuit is also entirely in the liquid phase, which is beneficial as the physical dimensions of the accumulator can remain relatively small.

In an embodiment, the accumulator 16 may comprise a wick material which due to its capillary properties will increase the surface area of the boundary between liquid and gas inside the accumulator thereby allowing faster evaporation and condensing inside the accumulator and thus allows faster control of the temperature of the fluid. In an embodiment the accumulator 16 comprises a wick material, the wick material being arranged so as to contact fluid inside the accumulator.

Figure 3:
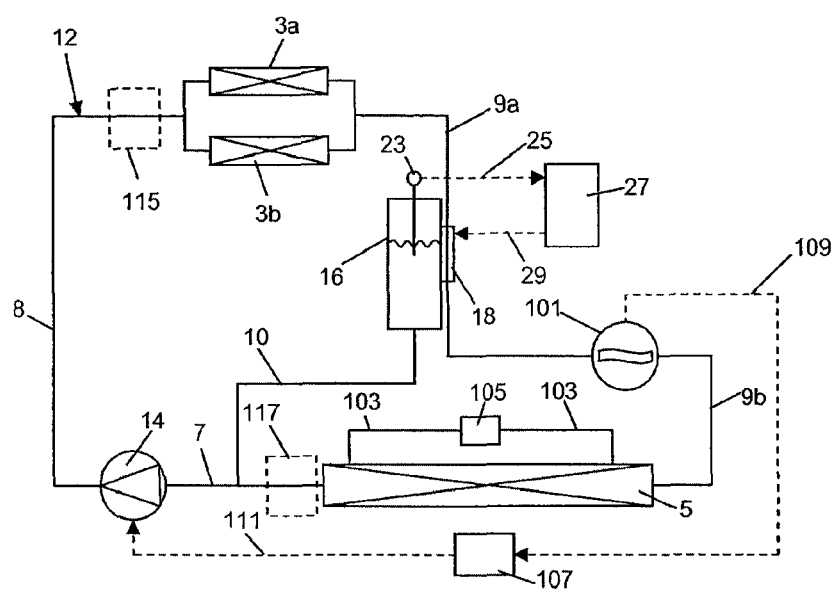
FIG. 3 depicts schematically a thermal conditioning system according to another embodiment of the invention.

FIG. 3 depicts schematically a two-phase cooling system according to another embodiment of the invention. The cooling system comprises a circuit 12 in which fluid is able to circulate. The circuit is build up from a pump 14 configured to pump the fluid through the circuit, evaporators 3a, 3b to be positioned in thermal contact with at least one part of a lithographic apparatus (not shown) for extracting heat from the at least one part by evaporation of the fluid inside the respective evaporators, a condenser 5 to remove heat from the fluid circulating in the circuit by condensation of the fluid inside the condenser, and a heater 101 to heat the fluid.

The pump 14 is connected to the evaporators 3a, 3b via fluid line 8. The evaporators 3a, 3b are arranged parallel to each other in the circuit 12 and are connected to the heater 101 via fluid line 9a. The heater 101 is connected to the condenser via fluid line 9b, and the condenser 5 is connected to the pump via fluid line 7. In an embodiment the thermal conditioning system is provided with multiple evaporators arranged in parallel inside the circuit. In a further embodiment of the thermal conditioning system, the mass flow to at least one of the multiple evaporators is controlled using a valve upstream of the at least one evaporator, and wherein, in an embodiment, the pressure in said at least one evaporator is controlled using a valve downstream of the at least one evaporator.

The condenser 5 is in fact a heat exchanger where heat is transferred from the fluid to another medium, e.g. a medium in the gas phase such as air, or a medium in the liquid phase such as water or any other coolant. In this embodiment, medium is provided via fluid lines 103 from a heat sink 105, e.g. a cryostat bath.

The cooling system further comprises an accumulator 16 to hold fluid in both the liquid phase as in the gas phase. The temperature of the fluid is measured by a temperature sensor 23. The accumulator is in fluid communication with the circuit 12 via fluid line 10 and is thereby able to exchange fluid with the circuit. The accumulator 16 is in thermal contact with a heat exchanger 18 which is able to transfer heat between the fluid in the accumulator and fluid in the fluid line 9a. The heat exchanger 18 is an active heat exchanger, e.g. using Peltier elements, and is controlled by a control unit or controller 27 based on a measurement signal 25 of the temperature sensor 23 representative of the temperature of the fluid inside the accumulator. The control unit 27 therefore provides a control signal 29 to the heat exchanger 18. The control unit is configured to maintain a constant temperature by regulating the heat exchanger.

The fluid leaving the evaporators may not have fully been evaporated, so that the fluid flow leaving the evaporators in that case is a mixed flow. The heater 101 may be configured to evaporate the liquid portion of the flow so that a gas flow of fluid is obtained. An advantage is that the flow resistance of a gas flow is less than for a mixed flow.

In addition the heater 101 may be used to raise the temperature of the fluid with a predetermined value, e.g. 1 degree Celsius, wherein the amount of energy to raise the temperature is representative for the amount of liquid fluid that was present in the mixed flow. Based on this information, a second control unit or controller 107 can regulate the pump 14 to optimize the mass flow through the circuit 12. The second control unit or controller therefore receives information from the heater 101 along communication line 109 and provides a control signal to the pump along communication line 111. In an embodiment, a main portion of the fluid flow is evaporated in the evaporators 3a, 3b. In an embodiment, if this portion increases, the pump 14 should be set to pump more fluid, and when this portion decreases, the pump should be set to pump less fluid.

It will be appreciated by the person skilled in the art of cooling systems that the cooling system can be adapted to the needs of the part or parts that require cooling. For instance, it is possible to use more evaporators in parallel. Further, it is also possible to provide evaporators in series. The heat exchanger associated with the accumulator may exchange heat with any suitable element or medium and does not necessary have to exchange heat with the fluid of the circuit. The pump may also be regulated on the basis of other information about the required cooling capacity which may even come from a further control unit directly or indirectly being responsible for the heating of the part to be cooled so that the information from the further control unit can be used to estimate the heat that is dissipated in or transferred to the part which is representative for the required cooling capacity.

In an embodiment, the temperature of the fluid leaving the condenser may be cooled to below the saturation temperature by a separate cooler 117. In another embodiment, the cooler 117 may be integrated with the condenser 5. An a further embodiment, subcooled liquid may be used to absorb at least a part of the heat in advance and allowing a two-phase heat transfer which may result in a single phase flow at the exit of the evaporator. This is beneficial as the pressure drop in the circuit reduces, resulting a more stable system.

In an embodiment, the system may also be used as a thermal conditioning system to transfer heat to the part of the lithographic apparatus. This can be achieved by a preheater 115 upstream of the evaporators 3a,3b which evaporates part of the fluid in fluid line 8 so that the evaporators can also function as condensers thereby transferring heat from the evaporators to the part of the lithographic apparatus depending on the temperature of the part. The preheater 115 of FIG. 3 provides a mixed flow of fluid in the liquid phase and gas phase to all evaporators. It is however also possible to provide a preheater per evaporator, so that more control of the condition of the fluids in each evaporator can be obtained.

In an embodiment, a method for thermal conditioning a part of a lithographic apparatus comprises: transporting a fluid around in a circuit, extracting heat from the part by evaporation of the fluid in an evaporator that is in thermal contact with the part, removing heat from the evaporated fluid in a condenser, providing an accumulator to hold fluid, wherein the accumulator is in fluid communication with the circuit to exchange fluid with the circuit, providing a heat exchanger to transfer heat from or to fluid inside the accumulator, measuring the temperature of the fluid, regulating the amount of heat transferred by the heat exchanger from or to fluid inside the accumulator based on the measured temperature of the fluid, thereby maintaining the temperature of the fluid at a substantially constant level, wherein the method further comprises one or more of the following, measuring the fluid quality of the fluid leaving the evaporator and based on the measured fluid quality adjusting the amount of fluid transported in the circuit, heating the fluid leaving the evaporator such that all fluid is in the gas phase. In a further embodiment, thermal conditioning is heating and/or cooling. In another embodiment the fluid quality corresponds to the portion of fluid in the liquid phase.

Figure 6A:
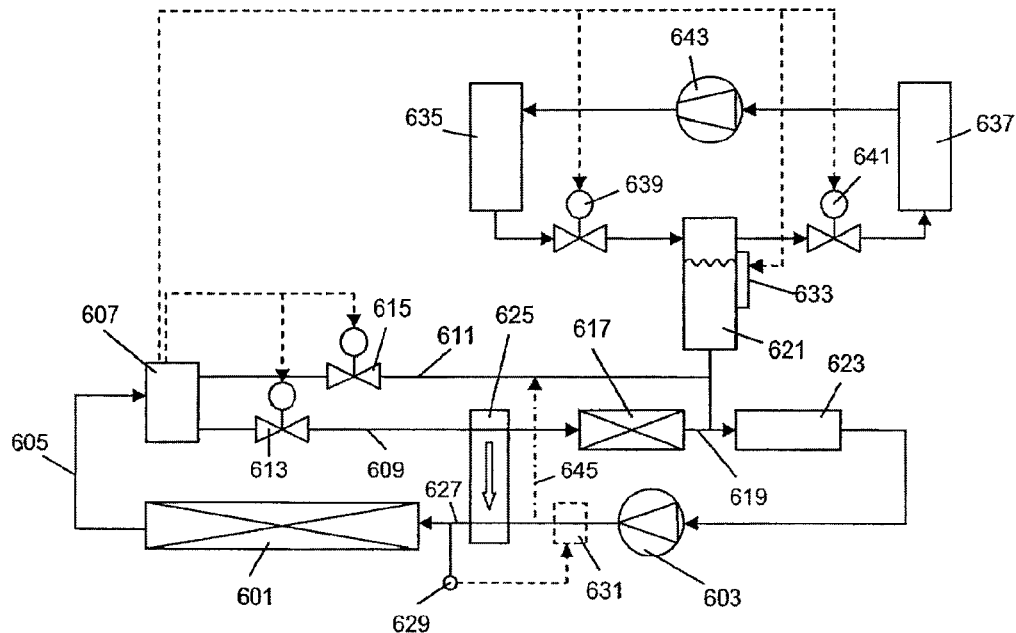
FIG. 6A depicts schematically a thermal conditioning system according to an embodiment of the invention.

FIG. 6A depicts a cooling system according to another embodiment of the invention. The cooling system comprises an evaporator 601 to be positioned in thermal contact with a part to be cooled for extracting heat from the part by evaporation of a fluid inside the evaporator 601.

The evaporator 601 is arranged in a circuit such that fluid is able to circulate in the circuit, thereby continuously passing the evaporator. The fluid is transported through the circuit by using a pump 603.

The cooling system of FIG. 6A is a two-phase cooling system, which means that heat is extracted from the part in the evaporator 601 by evaporation of the fluid. Depending on the amount of fluid transported through the evaporator and the heat transfer from the part to the fluid inside the evaporator, the fluid exiting the evaporator may be entirely in the gas phase or may be a mix of fluid in the gas phase and fluid in the liquid phase. The fluid flow in fluid line 605 can thus be of any kind of composition, i.e. the fluid flow ranges from being entirely in the liquid phase to being entirely in the gas phase.

Downstream of the evaporator, a phase shifter 607 is provided which separates the fluid in the gas phase from the fluid in the liquid phase so that the fluid flow in fluid line 609 is entirely in the gas phase and the fluid flow in fluid line 611 is entirely in the liquid phase. The phase shifter cooperates with the valves 613,615 in order to control the flows in both fluid lines 609,611.

The fluid line 609 continues towards a condenser 617 where heat is removed from the fluid inside the condenser by condensation of the fluid, so that the fluid is transformed into the liquid phase again. The fluid exiting the condenser is thus entirely in the liquid phase and can be recombined with the fluid in fluid line 611. Before entering the condenser 617, the fluid passes a heat exchanger which is able to exchange heat between the fluid in fluid line 611 and the fluid entering the evaporator 601.

Downstream of the condenser 617, the fluid line 619 leaving the condenser is connected to fluid line 611, wherein both fluid lines 611, 619 are connected to an accumulator 621 configured to hold fluid, and wherein the fluid held in the accumulator is at least partially in the liquid phase. The accumulator 621 acts as a reservoir from which fluid can be exchanged with the circuit in order to regulate the temperature of the fluid inside the circuit which is, in an embodiment, close to the saturation temperature.

In front of the pump 603 and downstream of the accumulator 621, an optional cooling device 623 is provided, which is configured to lower the temperature of the fluid to a predetermined value below the saturation temperature. The lower temperature prevents cavitation in the pump 603. Because the temperature of the fluid entering the evaporator 601 is, in an embodiment, close to the saturation temperature in order to allow evaporation inside the evaporator, the by the cooling device 623 cooled fluid needs to be heated again. Heating may occur by providing a heat exchanger 625 between the fluid line 609 containing the fluid in the gas phase and the fluid line 627 connected to the inlet of the evaporator. Heat from the fluid inside the fluid line 609 is then transported to the fluid inside the fluid line 627. In order to more accurately control the temperature of the fluid entering the evaporator, a temperature sensor 629 may be provided to measure the temperature of the fluid entering the evaporator 601 and a heater 631 may be provided to heat the fluid upstream of the temperature sensor, in this embodiment prior to entering the heat exchanger. The heater 631 may be provided instead of the heat exchanger 625, but may also be provided in addition to the heat exchanger 625.

In accordance with other embodiments of the invention, the accumulator 621 may be provided with a heat exchanging device 633 which allows to extract heat from the accumulator and allows to add heat to the accumulator in order to control the temperature of the accumulator, thereby controlling the overall temperature in the circuit. Hence, the temperature in the circuit is controlled in a thermal manner.

The embodiment of FIG. 6A has the benefit that the temperature in the circuit can also be controlled by regulating the pressure in the accumulator. This is beneficial when the thermal load of the evaporator is rapidly varying over time. In such a case, when the thermal load is rapidly increasing, the pressure increase inside the circuit is also rapidly increasing with a temperature increase as result. To regulate this temperature with sufficient speed, the heat exchanging device 633 has to have relatively high thermal power capabilities. These thermal power capabilities can be reduced by allowing pressure control as well.

The pressure inside the accumulator, and thus inside the entire circuit, can be controlled by providing two pressure reservoirs 635 and 637, which for instance contain high pressure nitrogen. The pressure inside pressure reservoir 635 is above the desired pressure inside the circuit and the pressure inside pressure reservoir 637 is below the desired pressure inside the circuit. The pressure inside the circuit can now be controlled by opening valve 639 when the pressure needs to be increased and by opening valve 641 when the pressure needs to be decreased. To maintain the pressure difference between the two pressure reservoirs, a compressor 643 is provided which requires significant less power to maintain the pressure difference than the thermal power required to regulate the temperature in case of rapidly changing thermal loads.

The valves 639 and 641, and the heat exchanging device 633 may be controlled by measuring the temperature and/or pressure inside the phase shifter 607. In an embodiment, the pressure reservoirs are used for rapid control of the pressure, and the heat exchanging device is used for slow control of the temperature. However, in an embodiment, the heat exchanging device 633 may be omitted, so that the temperature inside the circuit is controlled by pressure alone. In another embodiment, the pressure control may be omitted, so that the temperature inside the circuit is controlled by temperature alone. In an embodiment, the pressure in the system can be varied by adding a relative high frequent sine profile on the pressure control signal resulting in a high heat transfer at the peaks of the sine profile whereas the average temperature is the setpoint.

In case of an overpressure in the circuit, the circuit may comprise a bypass 645, which allows to circulate fluid in the liquid phase using the pump without the fluid being subject to the thermal load in the evaporator.

In front of the evaporator, a flow restriction may be provided which can beneficially be used in order to set the moment evaporation will start in the evaporator, thereby increasing the efficiency of the evaporator.

The phase shifter 607 and subsequent separation of fluid in the liquid and gas phase reduces the volume where fluid is a mixture of gas and liquid phase. As a result, there are less pressure variations and the volume of the accumulator 621 can be designed smaller as the possible volume changes due to different thermal loads is smaller.

The pressure may alternatively be controlled by using a reservoir which is connected to the circuit by a second pump, which pump is able to rapidly pump fluid in or out of the circuit in order to cope with rapidly changing thermal loads.

The cooling device 623 may also be replaced by separate cooling devices in fluid lines 609 and 611, so that each fluid line has its own cooling device 623. In such a case, the fluid line 611 may also comprise a separate pump in addition to pump 603.

In an embodiment, a buffer is provided downstream of the condenser which allows to rapidly deal with pressure changes, by filling and emptying the buffer.

In an embodiment, the pressure inside the accumulator 621 may be rapidly controlled using a bellow inside the accumulator of which the volume can be rapidly changed. For instance, the pressure reservoirs of FIG. 6A may be connected to the bellow instead of directly to the accumulator. Controlling the pressure inside the bellow will then allow pressure control in the accumulator. The bellow can also be attached to an actuator, which mechanically changes the volume of the bellow and thus the pressure inside the accumulator.

Instead of a bellow, the accumulator may be provided with a piston inside the accumulator, which is able to move inside the accumulator, thereby allowing to change the volume and thus the pressure in the accumulator for the fluid in the circuit. As for the bellow, the piston may be actuated by pressure regulated by the pressure reservoirs of FIG. 6A, hydraulically, or by using a separate actuator, e.g. a linear actuator, for controlling the position of the piston inside the accumulator.

In an embodiment, the pressure can also be controlled by setting the pump speed which sets the flow rate and thus sets the ratio between liquid phase and gas phase in the fluid line exiting the evaporator. In such a manner, a volume change due to a decrease in thermal load in the evaporator can be counteracted by reducing the pump speed. In an embodiment, a second pump may be provided which can be used to control the pressure inside the circuit. In an embodiment the controller is configured such that the vapor/liquid ratio is zero.

Figure 6B:
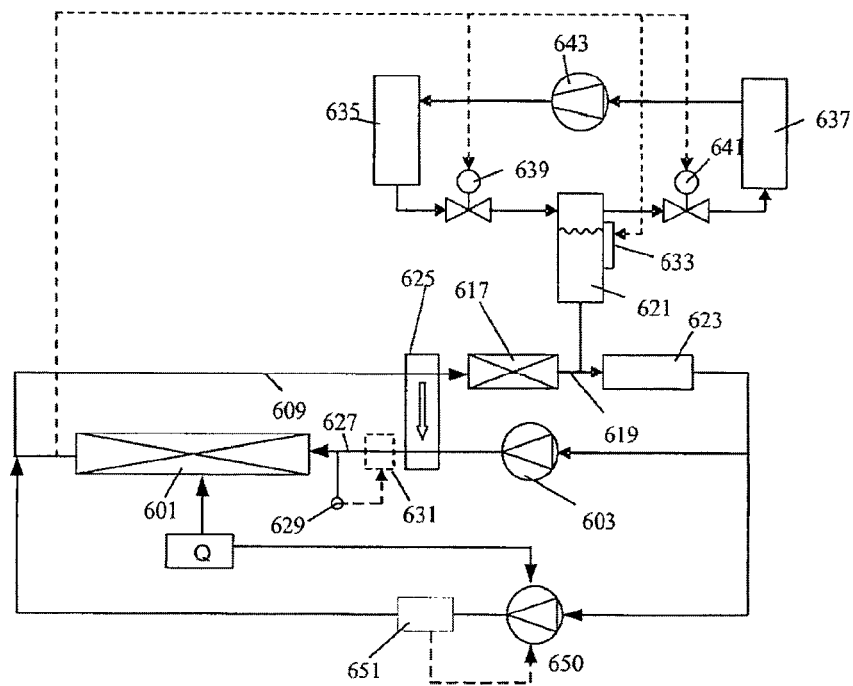
FIG. 6B depicts schematically a thermal conditioning system according to another embodiment of the invention.

FIG. 6B depicts a cooling system according to another embodiment of the invention. The cooling system comprises an evaporator 601 to be positioned in thermal contact with a part to be cooled for extracting heat from the part by evaporation of a fluid inside the evaporator 601.

The evaporator 601 is arranged in a circuit such that fluid is able to circulate in the circuit, thereby continuously passing the evaporator. The fluid is transported through the circuit by using a pump 603.

The cooling system of FIG. 6B is a two-phase cooling system, which means that heat is extracted from the part in the evaporator by evaporation of the fluid. Depending on the amount of fluid transported through the evaporator and the heat transfer from the part to the fluid inside the evaporator, the fluid exiting the evaporator may be entirely in the gas phase or may be a mix of fluid in the gas phase and fluid in the liquid phase. The fluid flow in fluid line 609 can thus be of any kind of composition, i.e. the fluid flow ranges from being entirely in the liquid phase to being entirely in the gas phase.

The fluid line 609 continues towards a condenser 617 where heat is removed from the fluid inside the condenser by condensation of the fluid, so that the fluid is transformed into the liquid phase again. The fluid exiting the condenser in fluid line 619 is thus entirely in the liquid phase. Before entering the condenser 617, the fluid passes a heat exchanger 625 which is able to exchange heat between the fluid in fluid line 611 and the fluid entering the evaporator 601.

Downstream of the condenser 617, the fluid line 619 is connected to an accumulator 621 configured to hold fluid, and wherein the fluid held in the accumulator is at least partially in the liquid phase. The accumulator acts as a reservoir from which fluid can be exchanged with the circuit in order to regulate the temperature of the fluid inside the circuit which is close to the saturation temperature.

In front of the pump 603 and downstream of the accumulator 621 an optional cooling device 623 is provided, which is configured to lower the temperature of the fluid to a predetermined value below the saturation temperature. The lower temperature prevents cavitations in the pump 603. Because the temperature of the fluid entering the evaporator is close to the saturation temperature in order to allow evaporation inside the evaporator, the by the cooling device 623 cooled fluid needs to be heated again. Heating may occur by providing a heat exchanger 625 between the fluid line 609 containing the fluid in the gas phase and the fluid line 627 connected to the inlet of the evaporator 601. Heat from the fluid inside the fluid line 609 is then transported to the fluid inside the fluid line 627. In order to more accurately control the temperature of the fluid entering the evaporator, a temperature sensor 629 may be provided to measure the temperature of the fluid entering the evaporator and a heater 631 may be provided to heat the fluid upstream of the temperature sensor. The heater 631 may be provided instead of the heat exchanger 625, but may also be provided in addition to the heat exchanger 625 as is shown in this embodiment.

In accordance with other embodiments of the invention, the accumulator 621 may be provided with a heat exchanging device 633 which allows to extract heat from the accumulator and allows to add heat to the accumulator in order to control the temperature of the accumulator, thereby controlling the overall temperature in the circuit. Hence, the temperature in the circuit is controlled in a thermal manner.

The embodiment of FIG. 6B has the benefit that the temperature in the circuit can also be controlled by regulating the pressure in the accumulator. This is beneficial when the thermal load of the evaporator is rapidly varying over time. In such a case, when the thermal load is rapidly increasing, the pressure increase inside the circuit is also rapidly increasing with a temperature increase as result. To regulate this temperature with sufficient speed, the heat exchanging device 633 has to have relatively high thermal power capabilities. These thermal power capabilities can be reduced by allowing pressure control as well or instead.

The pressure inside the accumulator, and thus inside the entire circuit, can be controlled by providing two pressure reservoirs 635 and 637, which for instance contain high pressure nitrogen. The pressure inside pressure reservoir 635 is above the desired pressure inside the circuit and the pressure inside pressure reservoir 637 is below the desired pressure inside the circuit. The pressure inside the circuit can now be controlled by opening valve 639 when the pressure needs to be increased and by opening valve 641 when the pressure needs to be decreased. To maintain the pressure difference between the two pressure reservoirs, a compressor 643 is provided which uses significant less power to maintain the pressure difference than the thermal power required to regulate the temperature in case of rapidly changing thermal loads.

The valves 639 and 641, and the heat exchanging device 633 may be controlled by measuring the temperature and/or pressure of the fluid leaving the evaporator. In an embodiment, the pressure reservoirs 635, 637 are used for rapid control of the pressure, and the heat exchanging device is used for slow control of the temperature. However, in an embodiment, the heat exchanging device 633 may be omitted, so that the temperature inside the circuit is controlled by pressure alone. In another embodiment, the pressure control may be omitted, so that the temperature inside the circuit is controlled by temperature alone.

Parallel to the pump 603, fluid line 627 and evaporator 601, a circuit branch comprising a pump 650 and a mass flow meter 651 is provided which allows to feed the fluid line 609 with fluid leaving the cooling device 623.

In a first embodiment, the pump 650 is controlled such that feeding the cooled fluid from the cooling device 623 to the fluid line 609 results in a single phase flow inside the fluid line 609 instead of a two-phase flow. Hence, the fluid in the gas phase leaving the evaporator is cooled to the liquid phase by mixing with fluid originating from the cooling device 623. As a result, the volume changes in the circuit are reduced, which requires a smaller accumulator. In this embodiment, mass flow meter 651 may be omitted.

In a second embodiment, the pump 650 is controlled to keep the ratio between fluid in the gas phase and fluid in the liquid phase in the fluid line 609 at a constant level. As a result, the volume changes in the circuit are reduced, which requires a smaller accumulator. A difference between the second embodiment and the first embodiment is that the pump 650 needs to be actively controlled based on the heat dissipation in the evaporator (measured in this embodiment by sensor Q) and mass flow meter 651. A benefit over the first embodiment is that the required pump capacity may be lower.

In a third embodiment, the pump 650 is controlled to keep the pressure inside the circuit at a constant level. As a result, the accumulator may be omitted as the pump 650 takes over the pressure and thus the temperature control of the circuit. This requires active control of the pump 650, where at least the measured pressure or temperature of the circuit is an input.

FIGS. 7A, 7B, 7C and 8 depict four different embodiments in which two thermal conditioning systems can be interconnected to cooperate with each other. These embodiments are different from the already shown embodiment of FIG. 3 where two parallel evaporators have been shown.

Figure 7A:
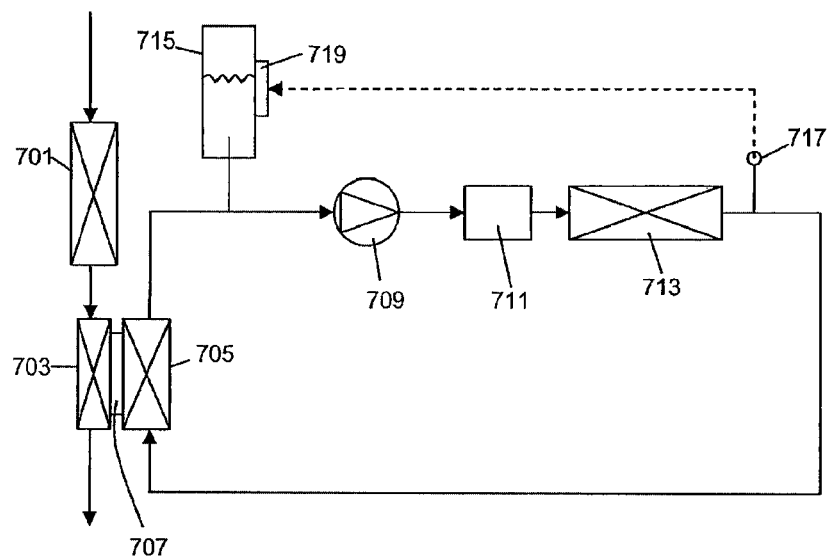
FIG. 7A depicts schematically a thermal conditioning system according to an embodiment of the invention.

In FIG. 7A, a first embodiment is shown of interconnecting two thermal conditioning systems according to the invention. On the left side of FIG. 7A, an evaporator 701 is shown which may be part of a cooling system according to an embodiment of the invention, e.g. one of the embodiments of FIG. 2, 3, 6A or 6B. Downstream of this evaporator, a heat exchanger 703 is provided which is able to exchange heat with a condenser 705 of an adjacent thermal conditioning system. In an embodiment, the thermal conditioning systems are configured such that the temperature in the heat exchanger 703 is always lower than the temperature in the condenser to facilitate heat transport in a predetermined direction, i.e. towards the heat exchanger. If heat transport in the other direction is required a Peltier element 707 may be provided to force heat transport in the other direction.

The condenser 705 is part of a fluid circuit in which fluid is circulated. Downstream of the condenser are respectively arranged a pump 709, a heater 711 and an evaporator 713 after which the fluid returns to the condenser again. An accumulator 715 is connected to the circuit between the condenser 705 and the pump 709. The working principle of this system is thus similar to the working principle of the cooling system of FIG. 2.

The temperature of the fluid exiting the evaporator 713 is measured using a temperature sensor 717, which output is used to control a heat exchanging device 719 at the accumulator to control the temperature of the fluid inside the accumulator and thereby the temperature in the circuit. In an alternative (not indicated) embodiment the output of the temperature sensor 717 may also be used to control the heater 711 to control the temperature of the fluid in the circuit. In a further embodiment the output of the temperature sensor 717 may also be used to control the heat exchanging device 719 and the heater 711 in a combination to control the temperature of the fluid in the circuit.

When the thermal conditioning system is used to control the temperature of a part of a lithographic apparatus, e.g. a substrate table, the heater 711 may be used to evaporate about 50% of the fluid entering the evaporator, so that the evaporator can be used to transport heat to the part by condensation of the by the heater evaporated fluid or to transport heat from the part by evaporation of the fluid not evaporated by the heater, thereby allowing for accurate temperature control. The condenser 705 condenses in an embodiment all the fluid so that the accumulator and the pump only deal with fluid transport in the liquid phase.

Figure 7B:
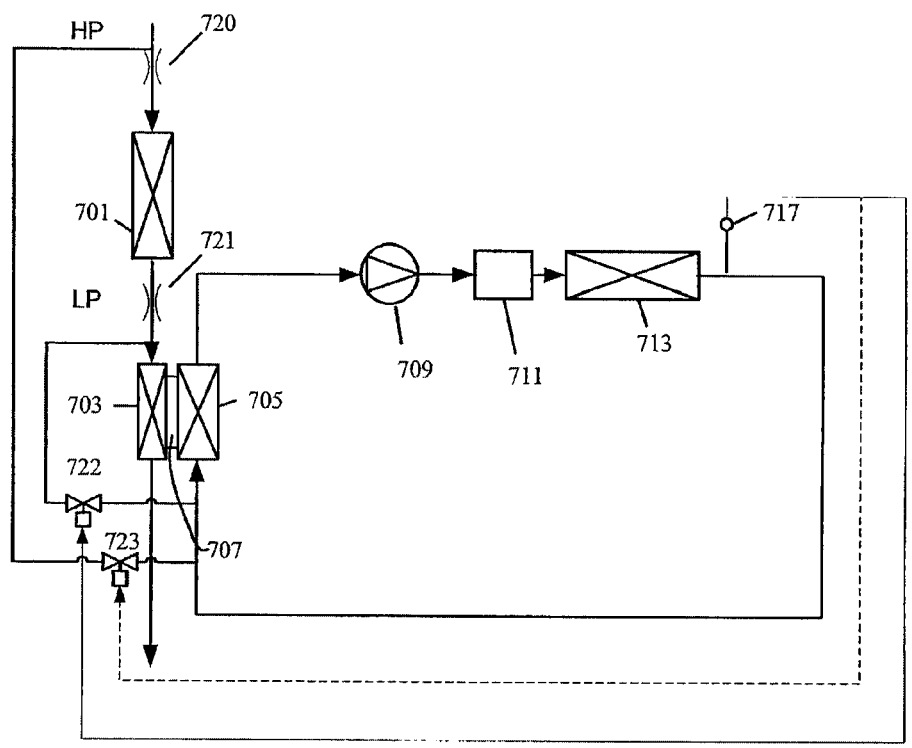
FIG. 7B depicts schematically a thermal conditioning system according to another embodiment of the invention.

FIG. 7B depicts a second embodiment of interconnecting two thermal conditioning systems according to the invention. On the left side of FIG. 7B, an evaporator 701 is shown which may be part of a system according to an embodiment of the invention, e.g. one of the embodiments of FIG. 2, 3, 6A or 6B. Downstream of this evaporator, a heat exchanger 703 is provided which is able to exchange heat with a condenser 705 of an adjacent thermal conditioning system. In an embodiment, the thermal conditioning systems are configured such that the temperature in the heat exchanger 703 is always lower than the temperature in the condenser to facilitate heat transport in a predetermined direction, i.e. towards the heat exchanger. If heat transport in the other direction is required a Peltier element 707 may be provided to force heat transport in the other direction.

The condenser 705 is part of a fluid circuit in which fluid is circulated. Downstream of the condenser are respectively arranged a pump 709, a heater 711 and an evaporator 713 after which the fluid return to the condenser again.

The two fluid circuit, i.e. the fluid circuit with the evaporator 701 and the fluid circuit with the evaporator 713 are interconnected via two valves 722 and 723. The valve 723 allows fluid communication between a location upstream of the evaporator 701 and a location upstream of the condenser 705. The valve 722 allows fluid communication between a location downstream of the evaporator 701 and a location upstream of the condenser. The pressure upstream of the evaporator 701 is higher than the pressure inside the fluid circuit including the evaporator 713, and the pressure downstream of the evaporator 701 is lower than the pressure inside the fluid circuit including the evaporator 713. The pressure difference may be set by respective fluid restrictors 720 and 721. The fluid restrictors 720 and 721 may be controllable to set the differential pressure to a predetermined value. Opening the valve 723 will then increase the pressure and thus the temperature inside the fluid circuit including the evaporator 713 and opening the valve 722 will lower the pressure and thus the temperature inside the fluid circuit including the evaporator 713. As a result, no accumulator to control the temperature is required as shown in FIG. 7A. The temperature may be measured using a temperature sensor 717 downstream of the evaporator 713. The output of the sensor 717 may be used to control the valves 722 and 723.

Figure 7C:
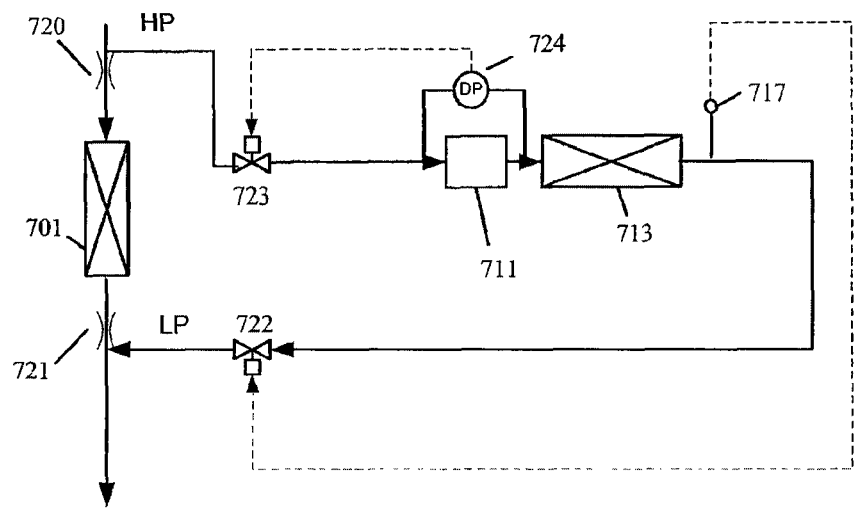
FIG. 7C depicts schematically a thermal conditioning system according to a further embodiment of the invention.

FIG. 7C depicts a third embodiment of interconnecting two thermal conditioning systems according to the invention. On the left side of FIG. 7C, an evaporator 701 is shown which may be part of a system according to an embodiment of the invention, e.g. one of the embodiments of FIG. 2, 3, 6A or 6B.

On the right an evaporator 713 is shown which is configured to be brought in thermal contact with another part than evaporator 701. The evaporator 713 is connected to a location upstream of the evaporator 701 of the other thermal conditioning system via a valve 723 and to a location downstream of the evaporator 701 of the other thermal conditioning system via a valve 722.

The pressure upstream of the evaporator 701 is higher than downstream of the evaporator 701, in particular with the aid of flow restrictors 720 and 721.

Between valve 723 and the evaporator 713, a heater 711 is provided to heat the fluid prior to entering the evaporator. The pressure difference over the heater 711 can be measured by a pressure sensor DP, the output of which can be used to control the valve 723 and thus the amount of fluid flowing through the evaporator 713. The temperature of the fluid leaving the evaporator 713 is measured by a temperature sensor 717, the output of which can be used to control the valve 722 and thus to control the pressure and temperature in the thermal conditioning system. In an alternative embodiment the pressure sensor DP is replaced by a general massflow meter (not shown) which is placed in the circuit between the valve 723 and the evaporator 713. The output of the massflow meter is used to control the valve 723 and thus the amount of fluid flowing through the evaporator 713. In an embodiment a coriolis massflow meter may be used.

A benefit of the embodiment of FIG. 7C over the embodiments of FIGS. 7A and 7B is that no accumulator and pump is used.

Figure 8:
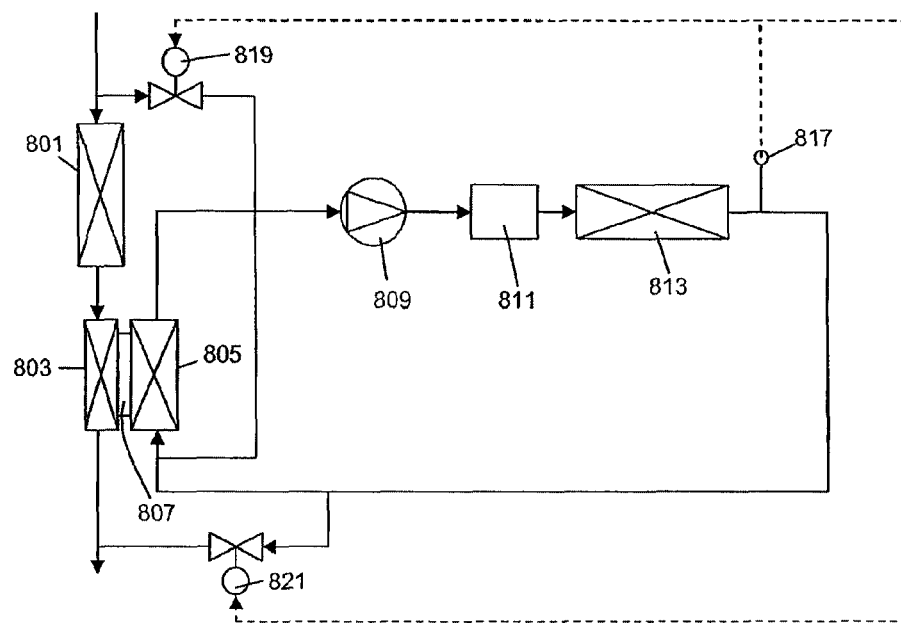
FIG. 8 depicts schematically a thermal conditioning system according to an embodiment of the invention.

FIG. 8 depicts a fourth embodiment of interconnected thermal conditioning systems. On the left side of FIG. 8, an evaporator 801 is provided, which evaporator is part of a system according to an embodiment of the invention, e.g. one of the embodiments of FIG. 2, 3, 6A or 6B. Downstream of the evaporator a heat exchanger 803 is provided which is able to exchange heat with a condenser 805 of an adjacent thermal conditioning system. In an embodiment, the systems are configured such that the temperature in the heat exchanger 803 is always lower than the temperature in the condenser 805 to facilitate heat transport in a predetermined direction, i.e. towards the heat exchanger. If heat transport in the other direction is required a Peltier element 807 may be provided to force heat transport in the other direction.

The condenser 805 is part of a fluid circuit in which fluid is circulated. Downstream of the condenser are respectively arranged a pump 809, a heater 811 and an evaporator 813 after which the fluid returns to the condenser 805 again. The pressure and thus the temperature in the circuit is regulated by a connection to a point upstream of the evaporator 801 and a connection to a point downstream of the heat exchanger 803, such that the pressure drop over the evaporator and the heat exchanger, in particular with the aid of a flow restrictor (now shown) located in the circuit between the evaporator 801 and the heat exchanger 803, is beneficially used. A valve 819 is provided in the upstream connection which can be opened when the pressure in the circuit needs to be increased, and a valve 821 is provided in the downstream connection which can be opened when the pressure in the circuit needs to be decreased. The valves 819, 821 are controlled based on the output of temperature sensor 817 which measures the temperature in the circuit downstream of the evaporator 813.

The embodiments of FIGS. 7A, 7B, 7C and 8 can beneficially be used when there are relatively large differences in the amount of circulated fluid in both thermal conditioning systems. The evaporators 701 and 801 are part in an embodiment of the system having the largest mass flow, such that the adjacent thermal conditioning system can be controlled or filled by a connection with said system. The adjacent thermal conditioning systems can be specifically designed for other purposes, for instance, millikelvin accuracy may be obtained when regulating the temperature of a substrate table, thereby improving accuracy of the lithographic apparatus.

In an embodiment the two-phase thermal conditioning system for thermal conditioning a part of a lithographic apparatus comprises: an evaporator to be positioned in thermal contact with the part of the lithographic apparatus for extracting heat from the part by evaporation of a fluid inside the evaporator, a condenser to be positioned at a distance from the part of the lithographic apparatus for removing heat from the fluid inside the condenser by condensation of the fluid inside the condenser, fluid lines arranged between the evaporator and the condenser to form a circuit in which fluid is able to flow, a pump arranged in the circuit to circulate the fluid in the circuit, wherein downstream of the evaporator a phase shifter is provided separating fluid in the gas phase from fluid in the liquid phase, and wherein a fluid line is provided between the phase shifter and the condenser for carrying the fluid in the gasp phase, and wherein a fluid line is provided between the phase shifter and the a location downstream of the condenser and upstream of the evaporator for carrying the fluid in the liquid phase.

In an embodiment, the two-phase thermal conditioning system for thermal conditioning a part of a lithographic apparatus comprises: an evaporator to be positioned in thermal contact with the part of the lithographic apparatus for extracting heat from the part by evaporation of a fluid inside the evaporator, a condenser to be positioned at a distance from the part of the lithographic apparatus for removing heat from the fluid inside the condenser by condensation of the fluid inside the condenser, fluid lines arranged between the evaporator and the condenser to form a circuit in which fluid is able to flow, a pump arranged in the circuit to circulate the fluid in the circuit, a temperature sensor configured to provide a measurement signal representative of the temperature of the fluid, a first pressure reservoir for holding a medium under a first pressure, said first pressure being below a desired pressure in the circuit, a second pressure reservoir for holding a medium under a second pressure said second pressure being above a desired pressure in the circuit, fluid lines and corresponding valves between respectively the first pressure reservoir and the circuit and between the second pressure reservoir and the circuit to apply the first and second pressure to the circuit, a controller configured to maintain a substantially constant temperature of the fluid inside the circuit by regulating the pressure inside the circuit using the corresponding valves associated with the first and second pressure reservoirs. In a further embodiment, the pressure of the first and second pressure reservoirs is applied to the circuit via a moveable or compressible member, e.g. via a moveable piston or a bellow, so that the piston or bellow separates the medium in the pressure reservoirs from the fluid in the circuit while applying the pressure to the circuit.

An another embodiment, the further thermal conditioning system lacks the accumulator, and instead has a first fluid line connection to a location upstream of the evaporator of the other thermal conditioning system and a second fluid line connection to a location downstream of the evaporator, said first and second fluid line comprising a respective valve, so that operation of the valves allows to control the pressure inside the circuit of the further thermal conditioning system.

Figure 4:
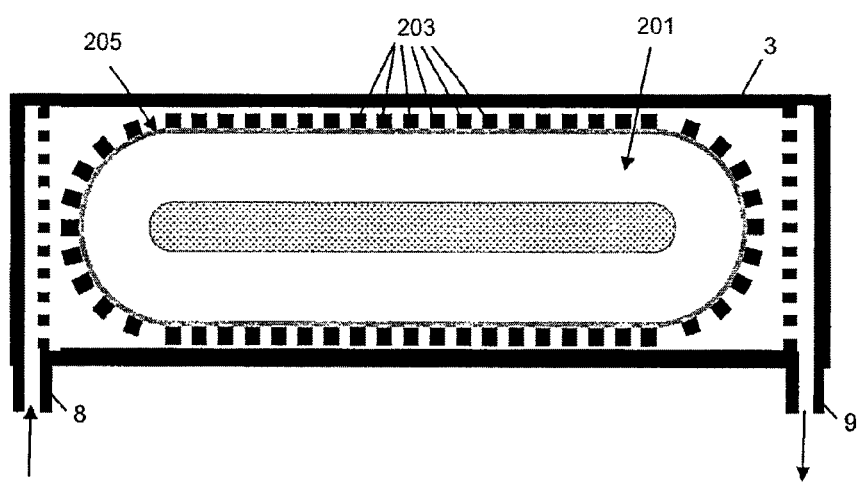
FIG. 4 depicts a coil of an electromagnetic actuator which can be cooled by a system according to an embodiment of the invention.

FIG. 4 depicts an application of a cooling system according to an embodiment of the invention. Shown are a coil 201 which is part of an electromagnetic actuator and is configured to cooperate with magnets. Providing a current through the coil in the presence of a magnetic field as may be provided by the magnets will result in the generation of forces that can be used to move or position parts of a lithographic apparatus.

As the coil will have an electrical resistance, running a current through the coil will result in heat dissipation. The relationship between current and force is a linear one while the relationship between current and heat dissipation is a quadratic one, so that generating a larger force will result in a dramatic increase of heat dissipation. This limits the forces that can be generated with the coil to a predetermined value determined by the temperature of the coil. To keep the temperature of the coil below a certain value, the coil is cooled. In prior art systems, a cooling plate with small channels is used through which water is able to run. However, smaller channels result in a laminar flow of the water and limited or reduced heat transfer capabilities.

Another drawback of using water as coolant is that water is not electrically isolating and therefore different layers have to be provided between the water and the coil to electrically isolate the coil from the water, which adds heat resistance and reduces cooling efficiency.

In FIG. 4, a two-phase cooling system is used to cool the coil, e.g. the system of FIG. 2, 3, 6A-6B, 7A-7C or 8. The coil is therefore placed in an evaporator 3 which allows fluid to flow around the coil. The medium is in an embodiment a fluid that is electrically isolating such as $CO_2$. The fluid is provided to the evaporator 3 via fluid line 8 and leaves the evaporator 3 via fluid line 9. While passing the coil, the fluid will evaporate and thereby extract heat from the coil. By using the cooling system according to an embodiment of the invention, a much higher heat transfer coefficient can be obtained then for the one-phase water cooling situation. This reduces the temperature of the coil dramatically and allows to increase the current through the coil which in turn results in larger forces.

The coil 201 is held by a nest of leaf springs 203 which keep the coil at a predetermined position but allows the coil to expand and crimp due to changes in temperature. Between the leaf springs and the coil an electrically isolating layer 205 is provided. The leaf springs can be optimized for thermal expansion and stiffness.

Figure 5:
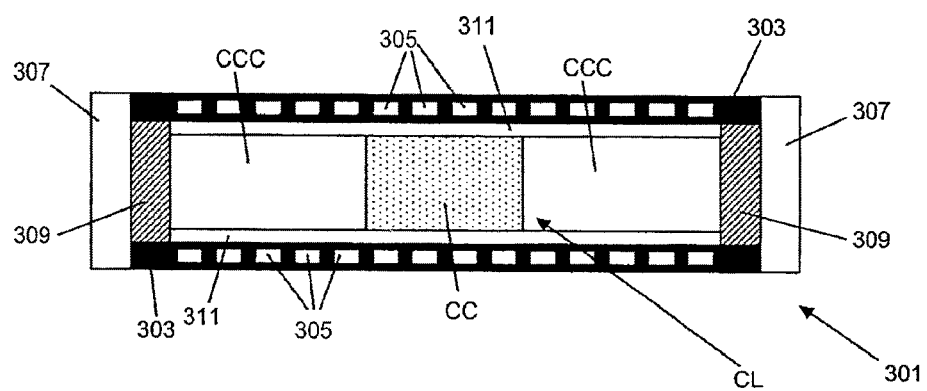
FIG. 5 depicts a cross-sectional schematic view of an electromagnetic actuator according to an embodiment of the invention.

FIG. 5 depicts a cross-sectional schematic view of an electromagnetic actuator 301 according to an embodiment of the invention which provides a solution to the following problem:

Prior art electromagnetic actuators which are cooled using a cooling system having a cooling plate with fluid carrying channels, comprise an elastic layer in between an electromagnetic coil and the cooling plate in order to allow differences in thermal expansion between the coil and the cooling plate while transferring forces generated by the coil to the cooling plate and thus to other parts of the actuator. Besides the required elastic properties and force transferring properties, the layer also is thermally conductive in order to easily transfer heat from the coil to the cooling plate via the layer. However, these demands are not easily met so that in current prior art systems the thermal conductivity is not as desired.

The electromagnetic actuator 301 of FIG. 5 has a coil CL with a coil core CC and current carrying conductors CCC, which coil CL is sandwiched in between two cooling plates 303 of a cooling system. The cooling plates 303 are provided with cooling channels 305 through which fluid is able to flow in order to extract heat from the coil CL when necessary.

When the coil is arranged in an appropriate magnetic field, a current flowing through the coil carrying conductors CCC of the coil CL will generate an actuation force. This force is transmitted, i.e. transferred, to other parts of the actuator, e.g. the frame parts 307 via force transferring material 309. The force transferring material 309 is elastic in order to deal with the thermal expansion of the coil CL. A benefit of arranging the force transferring material on the side of the coil CL is that the force transferring material no longer needs to transfer heat as well, so that more materials are suitable as force transferring material.

In order to transfer heat from the coil CL to the cooling plates 303, a thermal grease layer 311 is provided between the coil CL and the cooling plates 303. This thermal grease layer does not have to transfer forces, so that it may be optimized for heat transfer. When the coil expands due to an increasing temperature of the coil CL, the coil is able to slide relative to the cooling plates without any significant friction due to the presence of the thermal grease.

The electromagnetic actuator of FIG. 5 thus has separated the thermal transfer from the force transfer by providing separate elements for each function. As a result, both the heat transfer from coil to cooling plate and the force transfer may be improved as each element can be better optimized for its own function instead of optimizing a single element for both functions.

The cooling channels may be filled with any material, e.g. CO2. The cooling plate may be made from electrically isolating material, e.g. a ceramic material such as aluminum oxide, aluminum nitride or silicon nitride, in order to electrically isolate the coil from other parts of the actuator.

In case the cooling channels are filled with water, the number of allowable electrically isolating materials is limited due to interactions between the water and the electrically isolating material. For instance, ceramic materials are not always suitable as the water makes the ceramic material brittle and propagates crack forming. In such a case, other isolating materials such as plastics may be used, but electrical isolation may also be provided in other ways.

One of these other ways is to use an electrically isolating thermal grease between the coil CL and the cooling plates 303. An example of such a material is a material known under the trademark name sil-pad.

In another way, the cooling plates are provided with an electrically isolating layer on the side facing towards the thermal grease and the coil CL. Such a layer may be deposited on the cooling plate using electroplating, electrolytic deposition, anodizing or any other bonding technology. The materials may vary from ceramics to plastics such as BCB.

In yet another way, the single thermal grease layer may be replaced by providing an electrically isolating layer sandwiched in between two thermal grease layers.

In an embodiment, the electrically isolating material is also thermally conductive in order to efficiently transfer heat from the coil to the cooling plates while electrically isolating the two from each other.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A two-phase thermal conditioning system for thermal conditioning a part of a lithographic apparatus, the system comprising:
- an evaporator to be positioned in thermal contact with the part of the lithographic apparatus for extracting heat from the part by evaporation of a fluid inside the evaporator;
- a condenser to be positioned at a distance from the part of the lithographic apparatus for removing heat from the fluid inside the condenser by condensation of the fluid inside the condenser;
- fluid lines arranged between the evaporator and the condenser to form a circuit in which fluid is able to flow;
- a pump arranged in the circuit to circulate the fluid in the circuit;
- an accumulator configured to hold fluid, wherein the accumulator is in fluid communication with the circuit and comprises a heat exchanger to transfer heat from or to fluid inside the accumulator;
- a temperature sensor configured to provide a measurement signal representative of the temperature of the fluid; and
- a controller configured to maintain a substantially constant temperature of the fluid inside the circuit by regulating the amount of heat transferred by the heat exchanger from or to fluid inside the accumulator based on the measurement signal.

2. A thermal conditioning system according to claim 1, wherein thermal conditioning is heating and/or cooling.

3. A thermal conditioning system according to claim 1, wherein the accumulator is in fluid communication with a portion of the circuit in which all of the fluid is in the liquid phase.

4. A thermal conditioning system according to claim 1, wherein the temperature sensor is arranged downstream of the evaporator to provide a measurement signal that is representative of the temperature of the fluid leaving the evaporator.

5. A thermal conditioning system according to claim 1, comprising a heater to heat the fluid exiting the evaporator to a predetermined amount of degrees above the boiling point of the fluid, wherein the controller is configured to determine the amount of energy required to reach this temperature of the fluid, and wherein the controller is configured to regulate the pump in dependency of the amount of energy required to reach this temperature.

6. A thermal conditioning system according to claim 1, wherein the part of the lithographic apparatus is an actuator actively controlled by a further controller of the lithographic apparatus, and wherein the controller of the thermal conditioning system is configured to receive information from the further controller of the lithographic apparatus to estimate the amount of heat generated inside the actuator, and is configured to regulate the pump in dependency of the estimated amount of heat.

7. A thermal conditioning system according to claim 1, wherein the heat exchanger of the accumulator is configured to exchange heat with fluid in the circuit leaving the evaporator upstream of the condenser.

8. A thermal conditioning system according to claim 1, comprising a heater to heat the fluid leaving the evaporator to fully vaporize the fluid flow exiting the evaporator.

9. A thermal conditioning system according to claim 1, wherein the fluid is selected from the group consisting of: ammonia, R41, H2S, N2O, CO2, Ethane, R32, Propylene, Propane, DME, R22, R134a, 2-butene.

10. A thermal conditioning system according to claim 1, wherein the pump is arranged downstream of the condenser and the system is configured to lower the temperature of the fluid entering the pump to below the saturation temperature of the fluid to avoid cavitation inside the pump.

11. A thermal conditioning system according to claim 1, wherein the system is configured to hold the fluid in the circuit at a temperature of −250-100 degrees Celsius, and a pressure above 1 bar, such that the saturation temperature of the fluid is substantially equal to the actual temperature of the fluid inside the circuit.

12. A lithographic apparatus comprising:
- an illumination system configured to condition a radiation beam;
- a support constructed to support a patterning device, the patterning device being capable of imparting the radiation beam with a pattern in its cross-section to form a patterned radiation beam;
- a substrate table constructed to hold a substrate;
- a projection system configured to project the patterned radiation beam onto a target portion of the substrate, and
- a thermal conditioning system according to claim 1 to thermally condition a part of the lithographic apparatus.

13. A lithographic apparatus according to claim 12, comprising a positioning system to position the substrate table, the positioning system comprising at least one actuator, wherein the thermal conditioning system is configured to thermally condition the at least one actuator.

14. A two-phase thermal conditioning system for thermal conditioning a part of a lithographic apparatus, the system comprising:
- an evaporator to be positioned in thermal contact with the part of the lithographic apparatus for extracting heat from the part by evaporation of a fluid inside the evaporator;
- a condenser to be positioned at a distance from the part of the lithographic apparatus for removing heat from the fluid inside the condenser by condensation of the fluid inside the condenser;
- fluid lines arranged between the evaporator and the condenser to form a circuit in which fluid is able to flow;
- a pump arranged in the circuit to circulate the fluid in the circuit;
- a bypass fluid line starting at a location in the circuit in between the condenser and the pump and ending at a location in the circuit in between the evaporator and the condenser; and
- a second pump arranged in the bypass fluid line.

15. A thermal conditioning system according to claim 14, wherein thermal conditioning is heating and/or cooling.

16. A thermal conditioning system according to claim 14, wherein an additional cooling unit is provided downstream of the condenser and upstream of the location where the bypass fluid line starts, said cooling unit being configured to cool the fluid exiting the condenser to a temperature below the saturation temperature.

17. A thermal conditioning system according to claim 14, comprising a controller configured to control operation of the second pump such that the fluid downstream of the location where the bypass fluid line ends has a constant vapor/liquid ratio.

18. A thermal conditioning system according to claim 14, comprising a controller configured to control operation of the second pump in order to control the pressure inside the circuit.

19. A thermal conditioning system according to claim 1, comprising a further thermal conditioning system, wherein the condenser of the further thermal conditioning system exchanges heat with the fluid in the circuit of the other thermal conditioning system, by interconnecting the condenser of the further thermal conditioning system with the evaporator of the other thermal conditioning system or with a separate heat exchanger downstream of the evaporator of the other thermal conditioning system.

* * * * *